(12) United States Patent
Tanaka

(10) Patent No.: US 7,947,593 B2
(45) Date of Patent: May 24, 2011

(54) METHOD OF MANUFACTURING A SEMICONDUCTOR DEVICE HAVING AN INTERMETALLIC TERMINAL PAD AND SOLDER JUNCTION STRUCTURE

(75) Inventor: Yasuo Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 168 days.

(21) Appl. No.: 12/230,905

(22) Filed: Sep. 8, 2008

(65) Prior Publication Data

US 2009/0017610 A1    Jan. 15, 2009

Related U.S. Application Data

(62) Division of application No. 11/523,657, filed on Sep. 20, 2006, now Pat. No. 7,436,073.

(30) Foreign Application Priority Data

Sep. 30, 2005    (JP) .................. 2005-288270

(51) Int. Cl.
*H01L 21/44* (2006.01)
*H01L 23/52* (2006.01)
*H01L 23/48* (2006.01)
*H01L 29/40* (2006.01)

(52) U.S. Cl. ........ 438/614; 438/612; 438/613; 257/781; 257/737; 257/E21.476

(58) Field of Classification Search .......... 438/612–614; 257/781, 737, E21.476
See application file for complete search history.

(56) References Cited

U.S. PATENT DOCUMENTS

| | | | |
|---|---|---|---|
| 6,281,046 B1 * | 8/2001 | Lam | ............... 438/113 |
| 6,590,287 B2 | 7/2003 | Ohuchi | |
| 7,075,183 B2 | 7/2006 | Soga et al. | |

FOREIGN PATENT DOCUMENTS

| | | |
|---|---|---|
| JP | 4-258131 | 9/1992 |
| JP | 2001-93929 | 4/2001 |
| JP | 2001-94004 | 4/2001 |
| JP | 2001-298051 | 10/2001 |
| JP | 2001-298111 | 10/2001 |
| JP | 2001-335962 | 12/2001 |
| JP | 2002-16211 | 1/2002 |
| JP | 2002-185130 | 6/2002 |
| JP | 2002-261105 | 9/2002 |

* cited by examiner

Primary Examiner — Luan C Thai
(74) Attorney, Agent, or Firm — Rabin & Berdo, PC

(57) ABSTRACT

A method for manufacturing a semiconductor device includes providing a Zn system material directly on a copper terminal pad formed over an underlying base; disposing a Pb-free solder ball over the Zn system material; and performing a heating process for reflowing the Pb-free solder ball to thereby form a reactive product layer constituted of a component of the copper terminal pad and a component of the Zn system material between the copper terminal pad and the Pb-free solder ball.

6 Claims, 11 Drawing Sheets

METHOD OF MANUFACTURING A SEMICONDUCTOR DEVICE HAVING AN INTERMETALLIC TERMINAL PAD AND SOLDER JUNCTION STRUCTURE

CROSS-REFERENCE TO REPLATED APPLICATION

This is a Divisional of U.S. application Ser. No. 11/523,657, filed Sep. 20, 2006, that issued as U.S. Pat. No. 7,436,073 on Oct. 14, 2008, the subject matter of which is incorporated herein by reference.

BACKGROUND OF THE INVENTION

1. Field of the Invention

The present invention relates to a structure for a junction of a terminal pad and solder, wherein the terminal pad formed on an underlying base and the solder are joined to each other satisfactorily. The present invention also relates to a semiconductor device having the junction structure, and a method for manufacturing the semiconductor device.

2. Description of the Related Art

A semiconductor chip equipped with solder made molten by a heating process, such as a solder BGA (Ball Grid Array), an LGA (Land Grid Array) or the like, is in widespread use as a semiconductor device.

When the semiconductor device is manufactured, the solder, such as the BGA, LGA or the like, is bonded or joined to its corresponding terminal pad formed on an exposed surface of the semiconductor device (refer to, for example, Japanese Unexamined Patent Publication No. 2002-261105 (paragraphs 69 to 76 and FIG. 17). Further, when the semiconductor device is mounted onto a substrate, the solder, such as the BGA, LAG or the like, is bonded to its corresponding terminal pad of the substrate.

A junction structure (hereinafter called simply "junction structure") of the terminal pad and solder according to the prior art, which has been disclosed in Japanese Unexamined Patent Publication No. 2002-261105, will be explained below in detail with a semiconductor device having this junction structure as an example. Incidentally, the junction structure according to the prior art had a configuration in which the solder was disposed directly on its corresponding terminal pad by printing or plating.

Configuration of the semiconductor device having the junction structure according to the prior art disclosed in Japanese Unexamined Patent Publication No. 2002-261105 will be explained below with reference to FIG. 11. Incidentally, the semiconductor device will be described here with a semiconductor chip equipped with a BGA, i.e., a semiconductor chip in which a solder ball is mounted onto its corresponding terminal pad, as an example.

Incidentally, FIG. 11 is merely an approximate illustrations of the shape, size and physical relationship of each constituent element. Since sectional structures of semiconductor devices differ depending upon products, their detailed explanations are omitted here.

As shown in FIG. 11, a semiconductor device (hereinafter called simply a "semiconductor device according to the prior art") 100 having the junction structure according to the prior art is provided with an underbed or underlying base 105 corresponding to an area in which various semiconductor elements constituting the semiconductor device are formed, a conductive layer 110 formed on the underlying base 105, and an insulating layer 115 and a terminal pad 120 both formed on the conductive layer 110.

Incidentally, the terminal pad 120 is generally constituted of Cu (copper). Therefore, the terminal pad 120 will now be referred to as a Cu pad.

In the semiconductor device 100, a flux 130 is printed on the Cu pad 120, and a solder ball 140 is further mounted on the flux 130.

Process for manufacturing the semiconductor device according to the prior art will be explained below with reference to FIGS. 12(A) through 12(D). Incidentally, FIG. 12 shows fragmentary sectional cut areas obtained at respective process steps.

As shown in FIG. 12(A), a structure is prepared in which a terminal pad 120 is formed over an underlying base 105 of the semiconductor device 100. In the present structure, for example, wiring and other required conductive layer 110 are provided on the underlying base 105, and a Cu pad is provided on the conductor layer 110 as the terminal pad 120. Further, an insulating layer 115 that buries the periphery of the Cu pad 120 is provided over the underlying base 105. The top surface of the Cu pad 120 lies within the same plane as the top or upper surface of the insulating layer 115. Incidentally, the top surface of the Cu pad 120 is exposed to the outside and its exposed surface is covered with an oxide film (not shown) produced by allowing the Cu pad 120 and oxygen in the atmosphere to react with each other.

Next, as shown in FIG. 12(B), a flux 130 is applied onto the Cu pad 120. Thus, the oxide film formed at the exposed surface of the Cu pad 120 is removed to make it easy to bond solder and the Cu pad 120 to each other.

Next, as shown in FIG. 12(C), a solder ball 140 is mounted onto the flux 130.

Incidentally, a material containing Pb (lead), such as an Sn—Pb system, has been used as the conventional solder. Here, the term "Sn—Pb system" means a mixture of Sn and Pb (hereinafter called "Sn—Pb") itself or an Sn—Pb mixture containing other material of about a few wt % to a few tens of wt %. When the material is represented with its name being marked with "system", it is assumed to be indicative of its material per se or the material containing other material of about a few wt % to a few tens of wt % below.

Since, however, the solder containing Pb has defective conditions in that it destroys an surrounding environment and significantly erodes an apparatus for manufacturing a semiconductor device, for example, its use is being kept under control. Therefore, Pb-free solder (hereinafter called "Pb-free solder") is replacing Pb-containing solder (hereinafter called "Pb solder") as solder to be used. Incidentally, solder containing a mixture of Sn, Ag and Cu (hereinafter called "Sn—Ag—Cu system solder") is becoming main stream as the Pb-free solder.

Next, as shown in FIG. 12(D), the solder ball 140 is subjected to a heating process for performing reflow (hereinafter called the "reflow process") to melt the solder ball 140.

With the reflow process, the solder ball 140 melts to bond to the Cu pad 120, thereby forming a BGA 150.

At this time, the solder ball 140 reacts with the Cu pad 120 at a portion bonded to the Cu pad 120. Thus, a layer of an intermetallic reactive product 160 is formed between the Cu pad 120 and the solder ball 140. Incidentally, when the material for the solder ball 140 is, for example, a Sn—Pb system solder or a Sn—Ag—Cu system solder, a reactive product of Cu and Sn (hereinafter called "Cu—Sn reactive product"), specifically, $Cu_6Sn_5$ or the like is formed as the intermetallic reactive product 160.

The BGA, i.e., the semiconductor chip equipped with the melted solder ball 140 is manufactured in the above-described manner. Incidentally, a semiconductor chip equipped with an LGA is also manufactured by a process approximately similar to the manufacturing process shown in FIG. 12.

The solder, such as the BGA, LGA or the like, is bonded or joined to its corresponding terminal pad of the substrate when the semiconductor device is mounted to the substrate as described above.

A mounting structure according to the prior art will be explained below with reference to FIG. 13.

As shown in FIG. 13(A), terminal pads 520 are disposed on a substrate 500 at predetermined positions.

Incidentally, each of the terminal pads 520 is generally made up of Cu (copper). Therefore, the terminal pad 520 will now be explained as a Cu pad.

In the mounting structure according to the prior art, a semiconductor device 100 and the substrate 500 are laid out in such a manner that the surface on the formed side of each Cu pad 120 and the surface on the formed side of each Cu pad 520 are opposite to each other. In the example shown in FIG. 13(A), the surface on the side of formation of each Cu pad 120 is turned downward and the semiconductor device 100 is disposed on the substrate 500.

In this state, a reflow process, i.e., a heating process for reflowing each BGA 150 is performed to melt each BGA 150.

With the reflow process, the BGAs 150 melt to bond to their corresponding Cu pads 520 as shown in FIG. 13(B).

At this time, the BGAs 150 react with the Cu pads 520 at portions bonded to the Cu pads 520 respectively. Thus, a layer of an intermetallic reactive product (hereinafter called "intermetallic reactive product") 540 is formed at the portion bonded to each Cu pad 520. Incidentally, when the material for the BGA 150 is of, for example, Sn—Ag—Cu system solder, a Cu—Sn reactive product is formed as the intermetallic reactive product 540.

Thus, the BGA, the LGA or the like are bonded to the terminal pads 520 of the substrate 500.

However, the semiconductor device according to the prior art was accompanied by the problem that the reliability of the junction between the terminal pad and solder was low. This problem will be explained below.

The semiconductor device is subjected to thermal stress in the cases (A) through (C) shown below.

(A) The semiconductor device is subjected to thermal stress during a reflow process at the manufacture of the semiconductor device, i.e., a process for joining or bonding the terminal pad lying inside the semiconductor device and its corresponding solder by heating and cooling.

(B) The semiconductor device is subjected to thermal stress during a reflow process at the time that a semiconductor device provided thereinside with a junction structure of a terminal pad and solder is mounted to its corresponding substrate, that is, upon a process at the time that the terminal pad of the substrate and the solder of the semiconductor device are bonded to each other by heating and cooling.

(C) The semiconductor device is subjected to thermal stress during an operating process at the time that a product equipped with a semiconductor device provided thereinside with a junction structure of a terminal pad and solder is activated, and upon its stop process.

In the semiconductor device according to the prior art, cracks were prone to occur between the terminal pad and the solder due to the following reasons (1) through (3) in the main with the factor of the thermal stress applied in the cases of (A) through (C) referred to above. Incidentally, the term "between the terminal pad and the solder" means not only between the terminal pad lying inside the semiconductor device and the solder but also between the terminal pad of the substrate and the solder of the semiconductor device.

(1) In the semiconductor device according to the prior art, the Cu—Sn reactive product layer is formed at the junction portion between the terminal pad and the solder as the intermetallic reactive product.

The Cu—Sn reactive product layer is relatively large in thermal expansion coefficient based on heating and heat shrinkage rate or percentage based on cooling and thermal radiation. Therefore, the Cu—Sn reactive product layer is low in resistance to the thermal stress applied in the cases of (B) and (C). Hence, cracks were prone to occur in the junction portion between the solder and the terminal pad under an environment with a large difference in temperature in the semiconductor device according to the prior art.

Incidentally, the thermal stress applied in the cases of (B) and (C) referred to above concentrates on, particularly, a portion below the junction portion, i.e., an area on the terminal pad side of the Cu—Sn reactive product layer. Therefore, cracks have been apt to occur in the portion below the junction portion, i.e., the area on the terminal pad side of the Cu—Sn reactive product layer.

(2) In recent years, as the solder, Sn—Ag—Cu system solder that is in the main stream of Pb-free solder is being used as an alternative to Sn—Pb system solder that is in the main stream of Pb solder.

The resistance of the solder to the thermal stress applied in the cases of (A) through (C) referred to above trends to deteriorate as the hardness of the solder becomes higher.

The Sn—Pb system solder is a relatively soft material, whereas the Sn—Ag—Cu system solder is a material harder than the Sn—Pb system solder. Thus, the Sn—Ag—Cu system solder is lower than the Sn—Pb system solder in resistance to the thermal stress applied in the above cases of (A) through (C). Therefore, the Sn—Ag—Cu system solder makes the thermal stress easier to concentrate on the portion below the junction portion as compared with the Sn—Pb system solder. Thus, cracks have been prone to occur between the solder and the terminal pad.

(3) The semiconductor device has a tendency to pitch narrowing and thinning. Therefore, the diameter of the terminal is becoming smaller and the height thereof is becoming lower in the semiconductor device.

When the diameter of the terminal becomes smaller and the height thereof becomes lower, space for the junction portion between the solder and the terminal pad becomes small. Therefore, the thermal stress applied in the cases of (A) through (C) is apt to concentrate on the portion below the junction portion in the semiconductor device. Thus, cracks have been prone to occur in the portion below the junction portion between the solder and the terminal pad.

Thus, the semiconductor device according to the prior art made it easy to produce cracks between the terminal pad and the solder due to the above reasons of (1) through (3).

When cracks occur in the semiconductor device, a failure in junction occurs between the terminal pad and the solder due to the cracks.

Thus, for the semiconductor device according to the prior art, the reliability of the junction between the terminal pad and the solder was deteriorated due to the above reasons of (1) through (3), i.e., due to the fact that (1) the Cu—Sn reactive product layer is formed in the junction portion, (2) the hard Sn—Ag—Cu system solder is used instead of the soft Sn—Pb system solder as the solder, and (3) the semiconductor device is narrowed in pitch and made thin.

Thus, the semiconductor device according to the prior art was accompanied by a problem that the reliability of the junction between the terminal pad and the solder was low.

The problem that the reliability of the junction between the solder and the terminal pad is low is an important problem in terms of the evaluation of the reliability of the semiconductor device and is a very intractable problem.

The inventors of the present application have found out that if an alloy layer containing Zn is formed between the terminal pad and the solder, then the problems of the prior art can be resolved from the result of extensive investigations by paying attention to the following characteristics of (1) through (3) included in a Zn (Zinc) system material.

The Zn system material has the following three characteristics:

(1) the characteristic that the Zn system material is smaller than the Cu—Sn reactive product in thermal expansion coefficient based on heating and thermal shrinkage rate based on cooling or heat radiation, (2) the characteristic that the Zn system material is softer than the Sn—Ag—Cu system solder that is in the main stream of the material for the Pb-free solder, and (3) the characteristic that the Zn system material is lower in oxidative property than other material having the above characteristics (1) and (2).

The present invention has been made to solve the above problems. It is therefore an object of the present invention to provide a junction structure of a terminal pad and solder, wherein a Zn-containing alloy layer having the above characteristics (1) through (3) is formed between the terminal pad and the solder thereby to enhance reliability of a junction between the terminal pad and the solder, a semiconductor device having the junction structure, and a method for manufacturing the semiconductor device.

SUMMARY OF THE INVENTION

Such a junction structure according to a first invention is provided with a terminal pad formed over an underlying base, solder, and a reactive product layer constituted of a component of the terminal pad and a Zn system material, which is provided between the terminal pad and the solder.

Incidentally, the terminal pad is generally constituted of Cu. However, the terminal pad can be made up of other material. Further, the terminal pad can be brought to a multilayer structure constituted by overlapping of various materials. Described specifically, the terminal pad can be brought to a structure in which Ni (nickel) is disposed on a Cu pad and Pd (palladium) or Au (gold) or other material is further disposed thereon.

The solder is not limited to the Pb-free solder and may use a Pb solder.

The Zn system material may include, for example, Zn of approximately 100%, Sn—Zn system solder paste containing a flux of 10 wt % or so, etc. The Zn system material is disposed at a portion placed below a junction portion between the terminal pad and the solder, that is, it is disposed directly on the terminal pad, by plating or sputtering or the like where its component is Zn of approximately 100%, and/or by printing or plating where its component is of a Sn—Zn system solder paste or the like. Incidentally, particularly when the component is Zn of approximately 100%, the present invention can be applied to a semiconductor device equipped with an LGA.

A semiconductor device according to a second invention is provided with the junction structure of the terminal pad and the solder, according to the first invention.

A semiconductor device manufacturing method according to a third invention is a method of manufacturing the semiconductor device according to the second invention. The semiconductor device manufacturing method according to the third invention comprises the steps of disposing a Zn system material over a terminal pad formed over an underlying base, disposing solder over the Zn system material, and performing a reflow process, i.e., a heating process for reflowing the solder to thereby form a reactive product layer constituted of a component of the terminal pad and a Zn system material between the terminal pad and the solder.

According to the junction structure of the terminal pad and the solder, showing the first invention, a reactive product layer constituted of a component of the terminal pad and a Zn system material is provided between the terminal pad and the solder.

The Zn system material has the above-described characteristics (1) through (3). According to the junction structure of the terminal pad and the solder, it is therefore possible to enhance resistance of the junction portion between the terminal pad and the solder to thermal stress. Thus, although cracks eventually occur in the junction portion due to the thermal stress, its occurrence can be delayed. As a result, the reliability of the junction between the terminal pad and the solder can be enhanced over that of the prior art.

According to the semiconductor device of the second invention, resistance of a junction portion between the terminal pad and the solder to thermal stress can be enhanced based on the principle similar to the first invention. Thus, it is possible to delay the occurrence of cracks in the junction portion due to the thermal stress. As a result, the reliability of the junction between the terminal pad and the solder can be enhanced over that of the prior art.

According to the semiconductor device manufacturing method of the third invention, the semiconductor device according to the second invention can be manufactured.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 11:
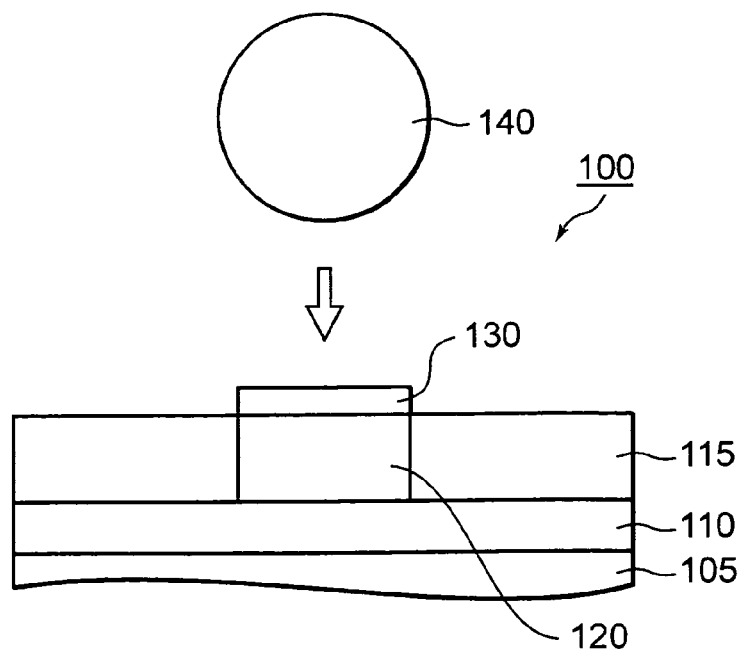
FIG. 11 is a configuration diagram of a semiconductor device having a junction structure according to a prior art.
Figure 12A:
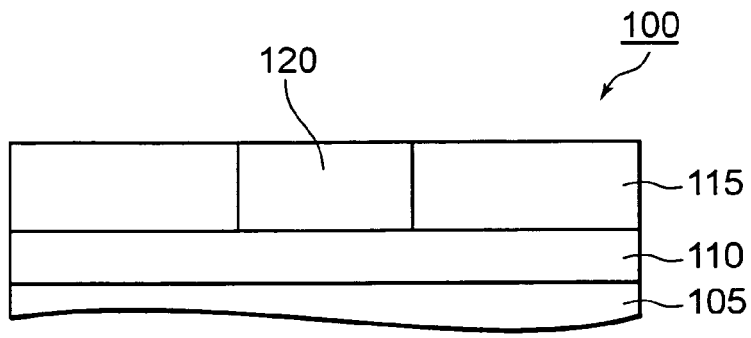
FIGS. 12A-12D show a manufacturing process diagram of the semiconductor device having the junction structure according to the prior art.
Figure 12B:
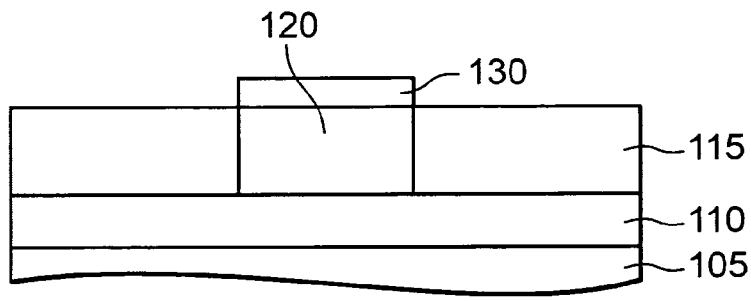
Figure 12C:
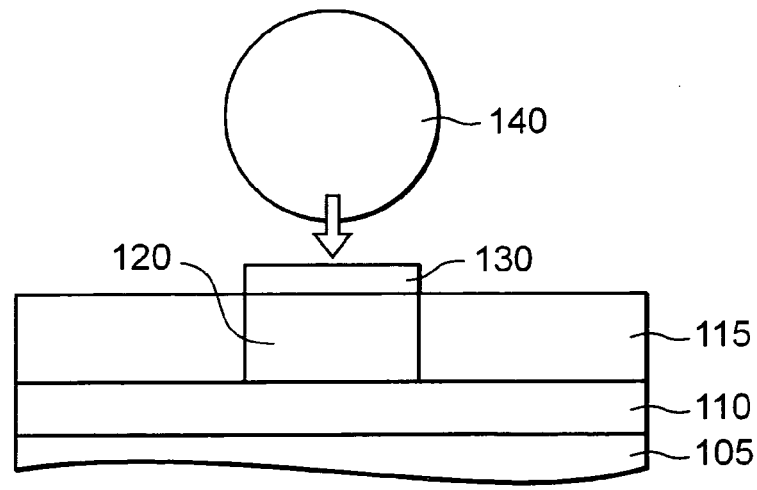
Figure 12D:
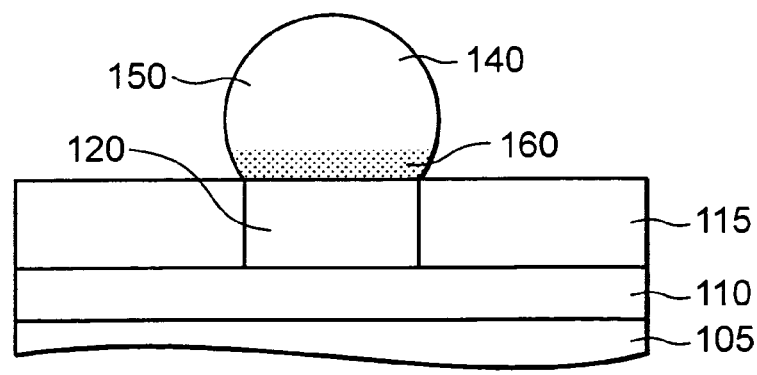

Preferred embodiments of the present invention will hereinafter be described with reference to the accompanying drawings. Incidentally, the shape, size and physical relationship of each constituent element or component in the figures are merely approximate illustrations to enable an understanding of the present invention. Therefore, the present invention is not limited only to examples illustrated in the figures. Constituent elements (refer to FIGS. 11 through 13) illustrated in the respective figures, which are similar to the prior art, are given the same reference numerals, so that duplicate explanations might be omitted. Further, common constituent elements and similar constituent elements illustrated in the respective figures are given the same reference numerals, so that duplicate explanations might be omitted. The respective process diagrams show fragmentary sectional cut areas of structures obtained at respective process steps. Since sectional structures of semiconductor devices differ depending upon products, their detailed explanations are omitted here.

First Preferred Embodiment

A structure of a junction (hereinafter called simply "junction structure") between a terminal pad 120 and solder 240, according to the present invention is provided with a reactive product layer comprised of a component of the terminal pad 120 and a Zn system or based material, which is provided between the terminal pad 120 formed over an underbed or underlying base and the solder 240 (refer to FIG. 2(D), FIG. 6(B), FIG. 8(D) and FIG. 9(B)).

The junction structure of the present invention can be applied to a spot where the terminal pad and the solder are both provided in a semiconductor device. The junction structure of the present invention can be applied even to spots where the terminal pad is provided at a substrate and the solder is provided in the semiconductor device.

The junction structure according to the first embodiment will be described below in detail with the semiconductor device having the junction structure as an example. Incidentally, the first embodiment is configured in such a manner that the Zn system material (e.g., Zn system solder paste, flux-containing Sn—Zn system solder paste, or the like) is placed on the terminal pad by printing.

Configuration of Semiconductor Device

The configuration of the semiconductor device (hereinafter called "semiconductor device according to the first embodiment") having the junction structure according to the first embodiment will be explained below with reference to FIG. 1. Incidentally, a semiconductor chip equipped with a BGA will be described here as the semiconductor device by way of illustration.

Figure 1:
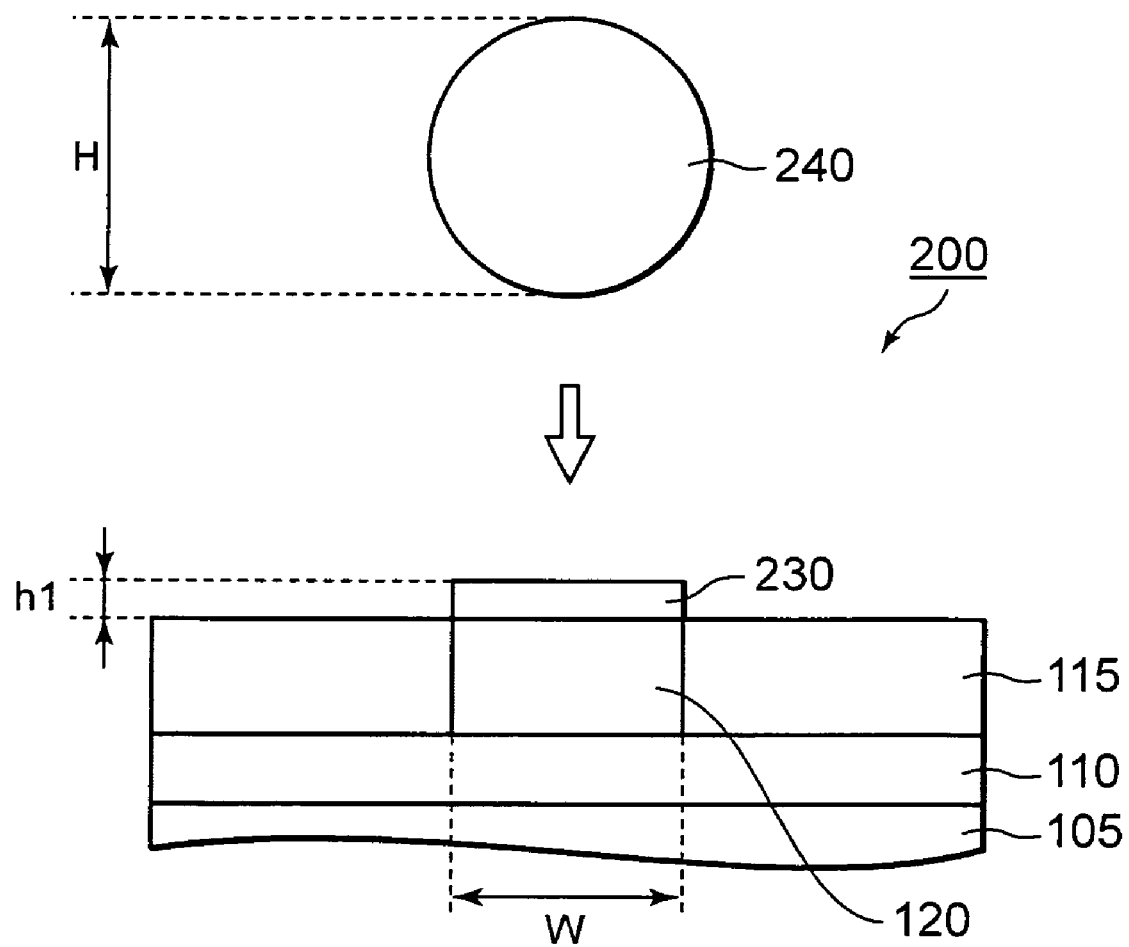
FIG. 1 is a configuration diagram of a semiconductor device having a junction structure according to a first embodiment.

As shown in FIG. 1, the semiconductor device 200 according to the first embodiment is provided with an underlying base 105 corresponding to an area in which various semiconductor elements are formed, a conductive layer 110 formed on the underlying base 105, and an insulating layer 115 and a terminal pad 120 both formed on the conductive layer 110. Incidentally, other constituent elements that constitute the semiconductor device are not shown in FIG. 1. The terminal pad 120 will be explained with a Cu pad as an example. Incidentally, the top face of the Cu pad 120 lies within the same plane as the top or upper surface of the insulating layer 115.

As shown in FIG. 1, the semiconductor device 200 according to the first embodiment is configured such that a Zn system material 230 is disposed on the Cu pad 120 by printing.

Incidentally, as the Zn system material 230, may be mentioned, for example, flux-containing Sn—Zn system solder (hereinafter referred to as "flux-containing Sn—Zn system solder" or called simply "Sn—Zn system solder"), or the like. Here, the Zn system material 230 will be explained assuming that it is Sn—Zn system solder paste containing Sn of 91 wt % and Zn of 9 wt % in composition ratio, for example. Incidentally, the term "Sn—Zn system" means a mixture of Sn and Zn (hereinafter called "Sn—Zn") itself or a Sn—Zn mixture containing other material of about a few wt % to a few tens of wt %. When the material is represented with its name being marked with "system", it is assumed to be indicative of its material per se or the material containing other material of about a few wt % to a few tens of wt % below. As the Sn—Zn system solder paste 230, one containing a flux of 10 wt % or so is generally used.

Incidentally, "w" in FIG. 1 indicates the width of each of the Cu pad 120 and the Zn system material 230, and "h1" in FIG. 1 indicates the height of the Zn system material 230. The widths, w, of the Cu pad 120 and the Zn system material 230 range from about 100 µm to 400 µm. The height, h1, of the Zn system material 230 ranges from about 10 µm to 60 µm.

A Pb-free solder ball 240 is placed on the Zn system material 230.

Incidentally, solder containing a mixture of Sn, Ag and Cu, i.e., Sn—Ag—Cu system solder becomes main stream as the material for the Pb-free solder ball 240. Thus, the Pb-free solder ball 240 will be explained here as the Sn—Ag—Cu system solder ball.

Incidentally, "H" indicates the diameter of the Pb-free solder ball 240 in FIG. 1. The diameter, H, of the Pb-free solder ball 240 ranges from about 100 µm to 450 µm.

Characteristics of Zn System Material

Now, the Zn system material 230 has the three characteristics (1) to (3) as already mentioned above.

The Zn system material 230 is higher than a Cu—Sn reactive product in resistance to thermal stress in terms of the characteristic (1) referred to above. Therefore, the Zn system material 230 is capable of relaxing concentration of the thermal stress as compared with the Cu—Sn reactive product.

The Zn system material 230 is susceptible to dispersion of thermal stress as compared with the Sn—Ag—Cu system solder in terms of the characteristic (2) referred to above. Therefore, the Zn system material 230 is capable of relaxing concentration of the thermal stress as compared with the Sn—Ag—Cu system solder.

Further, the Zn system material 230 is superior to other materials, in particular, in terms of the characteristic (3) referred to above and is capable of protecting the terminal pad 120. This results from the following reasons.

That is, as the material that satisfies the characteristics (1) and (2), may be mentioned, for example, Mg (Magnesium) or the like. Since, however, Mg is higher than the Zn system material 230 in oxidative property, it cannot protect the terminal pad 120. On the other hand, the Zn system material 230 is lower than Mg in its oxidative property although it has an oxidative property. The Zn system material 230 is one of such a degree that it can effectively be used as a protective film for the terminal pad 120. Therefore, the Zn system material 230 is particularly superior to other material, such as Mg or the like, and is capable of protecting the terminal pad 120.

Since the Zn system material 230 having the characteristics (1) through (3) is disposed directly on the Cu pad 120, the semiconductor device 200 is capable of enhanced resistance to thermal stress of a junction portion between the terminal pad 120 lying inside the semiconductor device 200 and the solder ball 240 as compared with the semiconductor device 100 according to the prior art. Therefore, although cracks eventually occur in the junction portion between the terminal pad 120 lying inside the semiconductor device 200 and the solder ball 240 due to the thermal stress, the semiconductor device 200 is capable of delaying its occurrence. As a result, the semiconductor device 200 is capable of enhanced reliability of the junction between the terminal pad 120 lying inside the semiconductor device 200 and the solder ball 240.

Manufacturing Process of Semiconductor Device

A process for manufacturing the semiconductor device 200 will be explained below with reference to FIGS. 2(A) through (D) and FIG. 3.

Figure 2A:
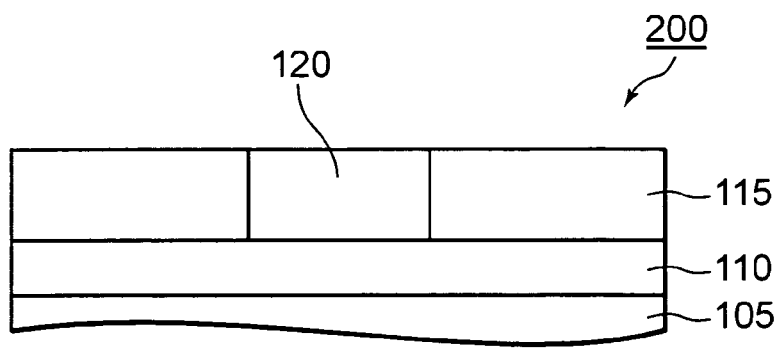
FIGS. 2A-2D show a manufacturing process diagram of the semiconductor device having the junction structure according to the first embodiment.

As shown in FIG. 2(A), a structure in which a terminal pad 120 is formed over an underbed or underlying base 105 of the semiconductor device 200 is prepared. In the present structure, for example, wiring and other required conductive layer 110 are provided on the underlying base 105, and a Cu pad is provided on the conductor layer 110 as the terminal pad 120. Further, an insulating layer 115 that buries the periphery of the Cu pad 120 is provided over the underlying base 105. The top surface of the Cu pad 120 lies within the same plane as the top or upper surface of the insulating layer 115. Incidentally, the top surface of the Cu pad 120 is exposed to the outside and its exposed surface is covered with an oxide film (not shown) produced by allowing the Cu pad 120 and oxygen in the atmosphere to react with each other.

Figure 2B:
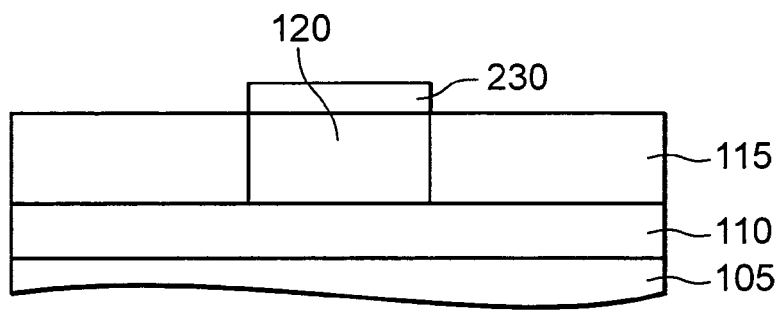

Next, as shown in FIG. 2(B), a Zn system material (Sn—Zn system solder paste in the present embodiment) 230 is disposed on the exposed surface of the Cu pad 120 by printing. Thus, a Zn system material softer than a Pb-free solder ball (Sn—Ag—Cu system solder ball in the present embodiment) 240 is disposed directly on the terminal pad 120 of the semiconductor device 200. Incidentally, one containing a flux of 10 wt % or so is generally used as the Sn—Zn system solder paste 230. The Sn—Zn system solder paste 230 removes the oxide film at the exposed surface of the Cu pad 120 by the so-contained flux.

Figure 2C:
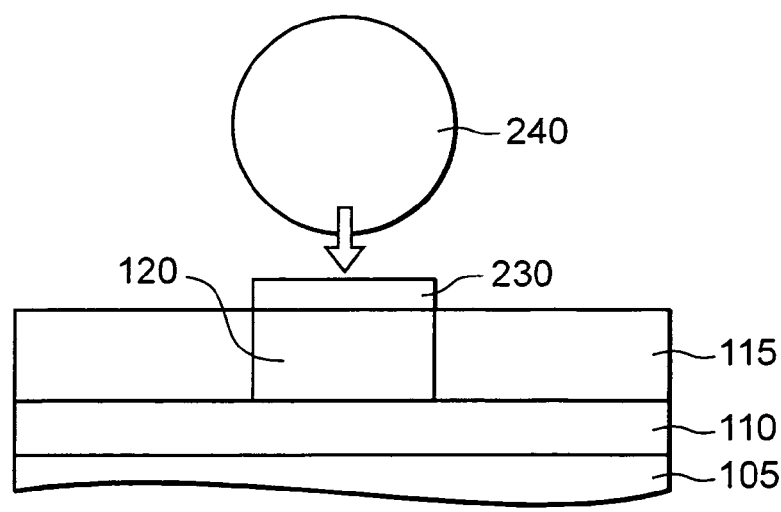

Next, as shown in FIG. 2(C), the Pb-free solder ball 240 is mounted on the Zn system material 230.

Figure 2D:
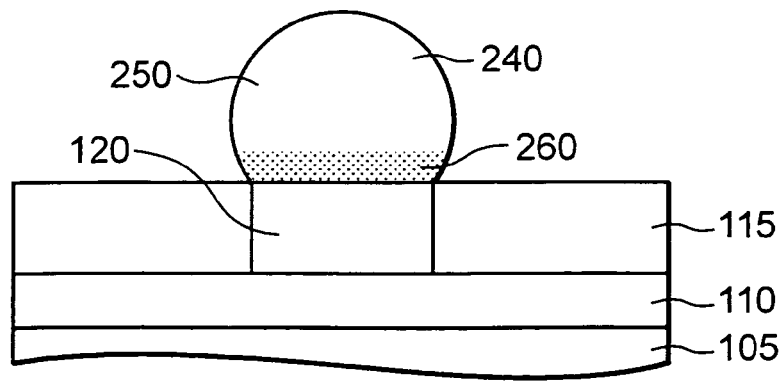
Figure 3:
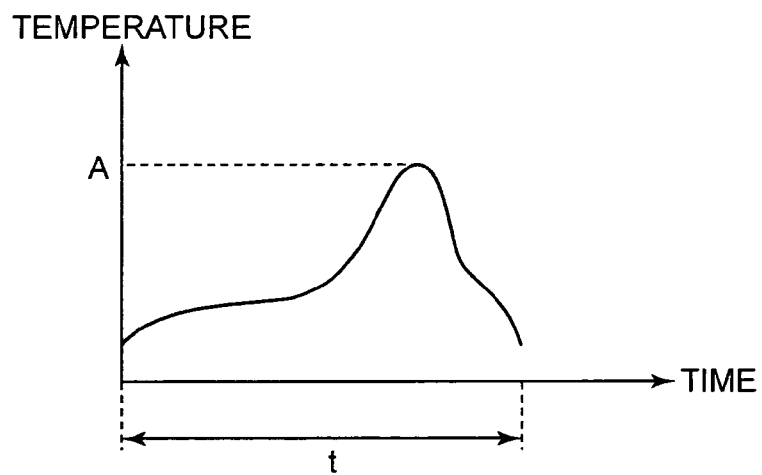
FIG. 3 is a temperature graphic diagram of a reflow process.

Next, as shown in FIG. 2(D), a reflow process is carried out along processing temperatures shown in FIG. 3 to melt the Pb-free solder ball 240.

Incidentally, FIG. 3 is a graphic diagram showing surface temperatures of the semiconductor device 200 at the reflow process. In FIG. 3, the vertical axis indicates temperature, and the horizontal axis indicates time. "A" indicates the maximum temperature at the reflow process, and "t" indicates a processing time at the reflow process. The maximum temperature A at the reflow process ranges from about 235° C. to 260° C. (i.e., greater than or equal to 235° C. and less than or equal to 260° C.), for example. The processing time, t, of the reflow process ranges from about 4 to 5 minutes per sheet.

With the reflow process, the Pb-free solder ball 240 melts to bond to the Cu pad 120 together with the Zn system material 230, thereby forming a BGA 250.

At this time, the Zn system material 230 reacts with the Cu pad 120 at a portion bonded to the Cu pad 120. Thus, a layer of a Zn-containing intermetallic reactive product (hereinafter called "Zn-containing intermetallic reactive product" or simply called "intermetallic reactive product") 260 is formed between the Pb-free solder ball 240 and the Cu pad 120. Incidentally, since the material for the Zn system material 230 is of Sn—Zn system solder paste here, a Cu—Zn reactive product is formed as the intermetallic reactive product 260.

Incidentally, the Zn system material 230 might need adjustments, such as an increase in active force of flux contained therein. Zn is an easily oxidizable metal. Therefore, there is a need to carry out the reflow process in a nitrogen atmosphere.

Since thermal stress is easily concentrated on the junction portion between the solder ball 240 and the Cu pad 120 in the semiconductor device 200, the Zn system material 230 having the characteristics (1) through (3) referred to above is laid out at the junction portion. Thus, the semiconductor device 200 has an improvement in resistance of the junction portion to thermal stress.

Incidentally, the semiconductor device 200, i.e., one based on the process step shown in FIG. 2(D) is shipmented or shipped as a product. However, one based on the process step shown in FIG. 2(B) can technically be shipped as a product.

Meanwhile, there is also considered such a configuration that the materials for the Zn system material 230 and the Pb-free solder ball 240 are both taken as an Sn—Zn reactive product. That is, there is also considered such a configuration that flux-containing Sn—Zn system paste is printed on the Cu pad 120 as the Zn system material 230 and an Sn—Zn solder ball is mounted on the flux-containing Sn—Zn system paste as the Pb-free solder ball 240.

Since, however, such a configuration has the following problems, it is undesirable. That is, such a configuration has the following problems:

(1) the problem that since the Sn—Zn reactive product is an easily oxidizable material, a stable semiconductor device 200 cannot be manufactured, and (2) the problem that since moisture resistance, i.e., such a characteristic that a state is maintained without experiencing deterioration over a long period under, for example, a high-moisture environment where the Z system material 230 and the Pb-free solder ball 240 are constituted by the Sn—Zn reactive product alone, is low, Zn in the Zn system material 230 and the Pb-free solder ball 240 are gradually oxidized by using the semiconductor device 200 under, for example, a high-temperature and high-moisture environment, thereby making it easy to reduce the strength of a junction between the solder ball 240 and the Cu pad 120.

Accordingly, preferably both the Zn system material 230 and the Pb-free solder ball 240 are not constituted by the Sn—Zn reactive product.

As the combination of the Zn system material 230 and the Pb-free solder ball 240, such a configuration that the Zn system material 230 is taken as flux-containing Sn—Zn system solder, and the Pb-free solder ball 240 is taken as Sn—Ag—Cu system solder is most preferable because the problems of the above (1) and (2) do not occur.

Evaluation of Resistance of Semiconductor Device to Thermal Stress

The evaluation of resistance of the semiconductor device 200 to thermal stress will be explained below with reference to FIGS. 1, 4 and 5.

The evaluation of the resistance to the thermal stress is effected on the semiconductor device 200 by the following method or technique.

An evaluating process is effected on the semiconductor device 200 in which, for example, the width, w, of each of the Cu pad 120 and the Zn system material 230 is set to 100 to 400 μm, the height, h1, of the Zn system material 230 is set to 40 to 60 μm, and the height, H, of the Pb-free solder ball 240 is set to 100 to 500 μm (refer to FIG. 1).

Figure 4:
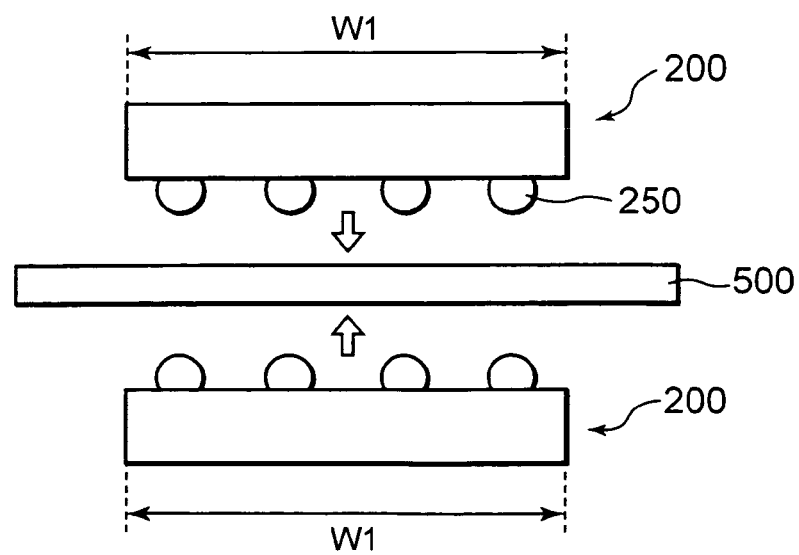
FIG. 4 is a diagram (1) for describing an evaluating process.

Semiconductor devices 200 are mounted on both surfaces of a substrate 500 as shown in FIG. 4. Incidentally, "W1" in FIG. 4 indicates one side of the semiconductor device 200. The one side, W1, of the semiconductor device 200 is 6 mm or so, for example.

Figure 5:
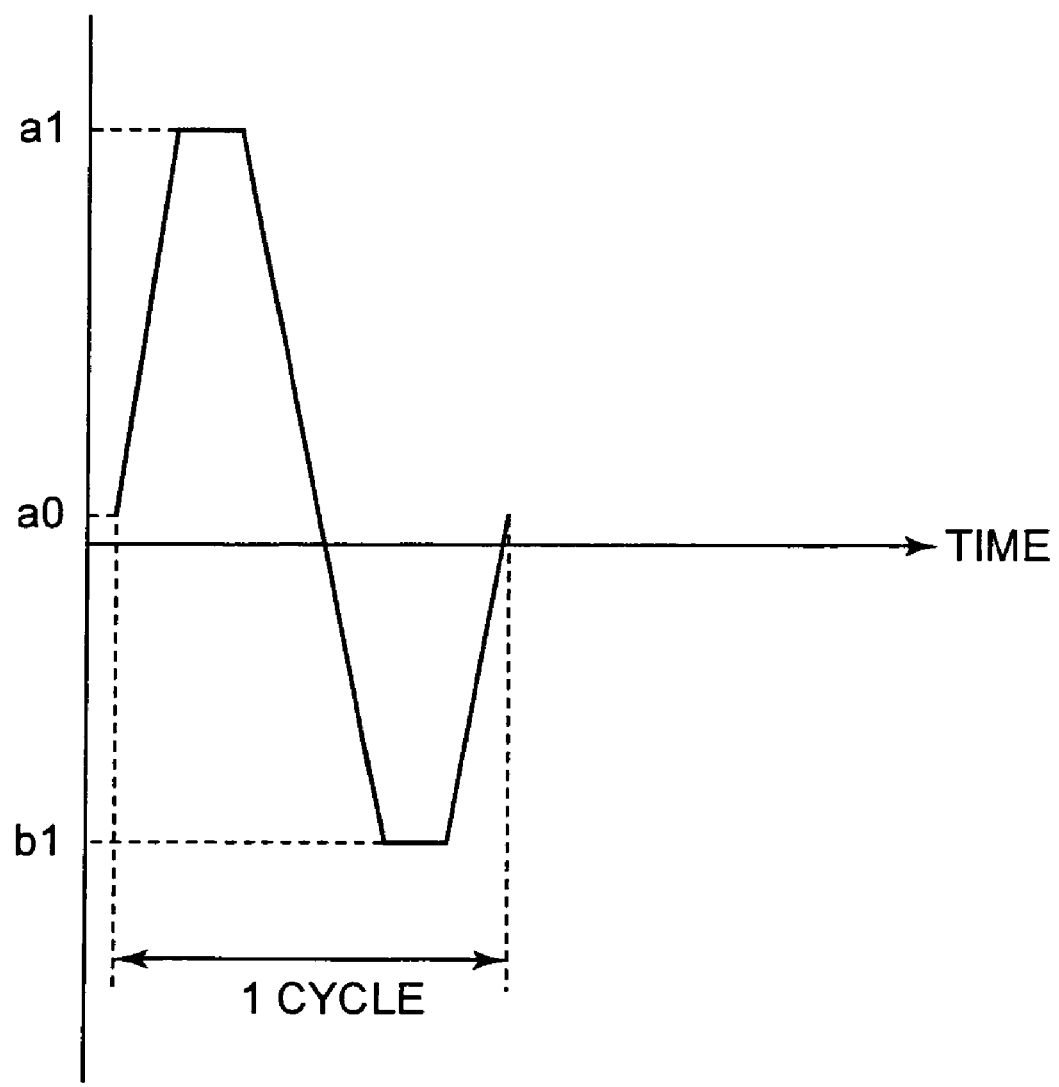
FIG. 5 is a diagram (2) for describing the evaluating process.

Next, a heating process and a cooling process are alternately effected on the semiconductor devices 200 mounted onto both surfaces of the substrate 500 with processing temperatures as shown in FIG. 5.

Incidentally, FIG. 5 is a graphic diagram showing surface temperatures of each semiconductor device 200 during the heating and cooling processes. In FIG. 5, the vertical axis indicates temperature, the horizontal axis indicates time, "a0" indicates room temperature (15° C. if described specifically), "a1" indicates the highest temperature during the heating process, and "b1" indicates the lowest temperature during the cooling process, respectively. The maximum temperature, a1, during the heating process is a few hundreds of +° C., and the lowest temperature, b1, during the cooling process is a few tens of −° C.

Upon the evaluating process, the combination of the heating and cooling processes is defined as one cycle, and this is repeated a few hundreds to a few thousands of times. Thus, thermal stress is applied to each semiconductor device 200.

Finally, a change in resistance value at the junction portion between the solder ball 240 and the Cu pad 120 in each semiconductor device 200 is measured. If cracks are produced in the junction portion at this time, then the resistance value becomes larger than a normal semiconductor device, i.e., a crack-free semiconductor device.

According to the semiconductor device 200 of the first embodiment, the occurrence of cracks in the junction portion between the Cu pad 120 lying inside the semiconductor device 200 and the solder ball 240 can be delayed as compared with the semiconductor device 100 according to the prior art.

Incidentally, when the height, h1, of the Zn system material 230 ranges from 0.40 μm to 60 μm, a satisfactory result could be obtained in the semiconductor device 200 during an actual evaluating process. However, there is a possibility that even when the height, h1, of the Zn system material 230 is less than 40 μm, a satisfactory result will be obtained in the semiconductor device 200. When, however, the height, h1, of the Zn system material 230 is excessively small, the semiconductor device 200 tends to deteriorate in reliability and moisture resistance at the junction with the substrate. The reliability and moisture resistance at the junction with the substrate are the most important items upon evaluating the reliability of the semiconductor device 200. Therefore, it is undesirable that the height, h1, of the Zn system material 230 is excessively small. There is a possibility that even when the height, h1, of the Zn system material 230 is greater than 60 μm in reverse, the semiconductor device 200 will obtain a satisfactory result. When, however, the height, h1, of the Zn system material 230 becomes excessively large, the semiconductor device 200 tends to deteriorate in reliability and moisture resistance at the junction with the substrate. Therefore, an excessive increase in the height, h1, of the Zn system material 230 is also undesirable. The height, h1, of the Zn system material 230 may preferably be set to about 10 to 60 μm on the whole where its allowable value is taken into consideration.

Mounting Structure of Semiconductor Device

Figure 13A:
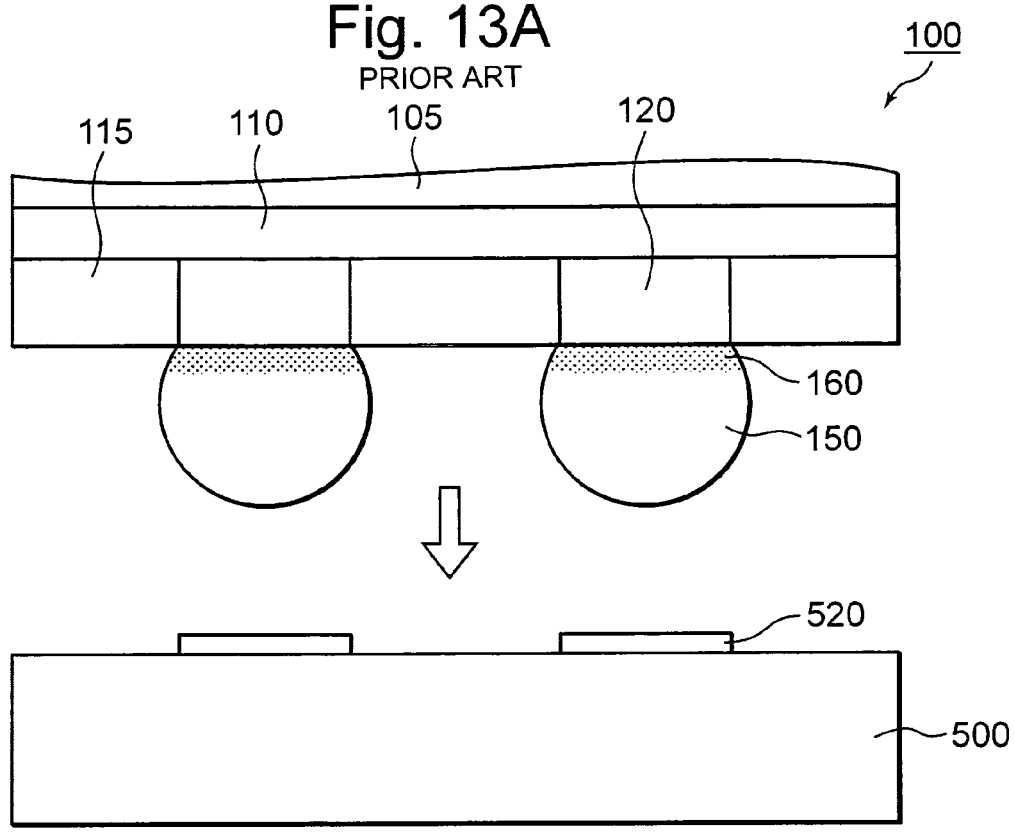
FIGS. 13A and 13B is a mounting process diagram of the semiconductor device having the junction structure according to the prior art.
Figure 13B:
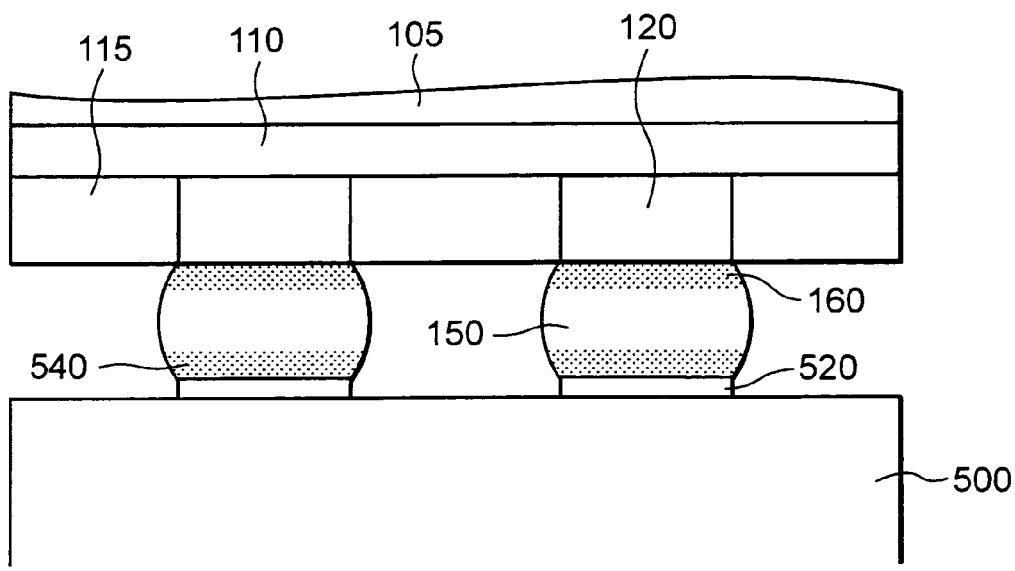

In the mounting structure (hereinafter called "mounting structure according to the prior art") of the semiconductor device having the junction structure according to the prior art, the BGA 150 of the semiconductor device 100 has been mounted directly on the terminal pad (hereinafter called "Cu pad") 520 of the substrate 500 (refer to FIG. 13(A)).

In contrast, a mounting structure (hereinafter called "mounting structure according to the first embodiment") of a semiconductor device having the junction structure according to the first embodiment is as follows: A Zn system material is placed on each Cu pad 520 of a substrate 500, and each of BGAs 250 of the semiconductor device 200 is mounted onto the Zn system material.

The mounting structure according to the first embodiment will be explained below with reference to FIG. 6.

Figure 6A:
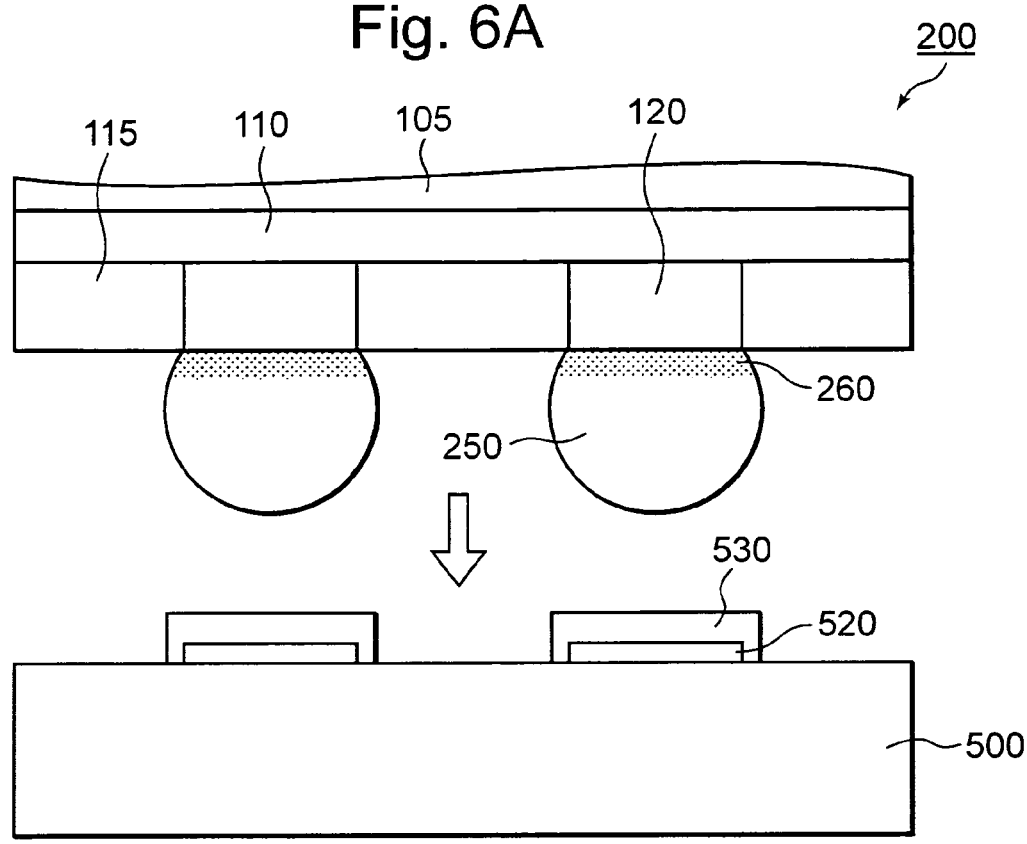
FIGS. 6A and 6B show a mounting process diagram of the semiconductor device having the junction structure according to the first embodiment.

As shown in FIG. 6(A), the Cu pads 520 and their corresponding Zn system materials 530 are disposed over the substrate 500 at predetermined positions respectively.

Incidentally, as the Zn system material 530, may be mentioned, for example, flux-containing Sn—Zn system solder (hereinafter called "flux-containing Sn—Zn system solder" or called simply "Sn—Zn system solder") or the like in a manner similar to the Zn system material 230. The Zn system material 530 will be described as Sn—Zn system solder paste in the present embodiment. In the example illustrated in FIG. 6(A), the Zn system material (flux-containing Sn—Zn system solder paste) 530 is disposed on each Cu pad 520 by printing.

In the mounting structure according to the first embodiment, the semiconductor device 200 and the substrate 500 are laid out in such a manner that the surface on the formed side of each Cu pad 120 and the surface on the formed side of each Cu pad 520 are opposite to each other. In the example shown in FIG. 6(A), the surface on the side of formation of each Cu pad 120 is turned downward and the semiconductor device 200 is disposed on the substrate 500.

At this time, the Zn system material 530 is disposed between the BGA 250 of the semiconductor device 200 and the Cu pad 520 of the substrate 500.

In this state, a reflow process, that is, a heating process for reflowing the BGA 250 is performed to melt the BGA 250.

Figure 6B:
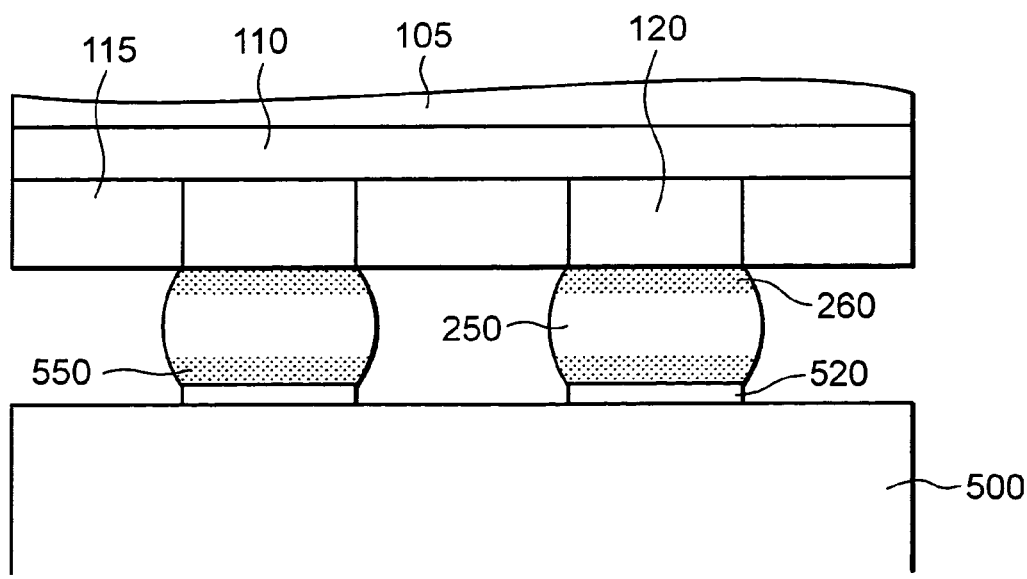

With the reflow process, the BGAs 250 melt to bond to their corresponding Cu pads 520 together with the Zn system materials 530 as shown in FIG. 6(B).

At this time, the Zn system materials 530 react with the Cu pads 520 at portions bonded to the Cu pads 520 respectively. Thus, a layer of a Zn-containing intermetallic reactive product (hereinafter called "Zn-containing intermetallic reactive product" or simply called "intermetallic reactive product") 550 is formed between each of the BGAs 250 and each of the Cu pads 520. Incidentally, since the material for the Zn system material 530 is of Sn—Zn system solder paste here, a Cu—Zn reactive product is formed as the Zn-containing intermetallic reactive product 550.

Since the Zn system material 530 having the characteristics (1) through (3) is laid out between each BGA 250 of the semiconductor device 200 and each terminal pad 520 of the substrate 500, the mounting structure according to the first embodiment shown in FIG. 6 is capable of enhanced resistance of the junction portion between the BGA 250 of the semiconductor device 200 and the terminal pad 520 of the substrate 500 to thermal stress. Therefore, although cracks are eventually produced in the junction portion between the BGA 250 of the semiconductor device 200 and the terminal pad 520 of the substrate 500 due to thermal stress, the mounting structure is capable of delaying the occurrence of cracks. As a result, the present mounting structure is able to enhance reliability of the junction between the BGA 250 of the semiconductor device 200 and the terminal pad 520 of the substrate 500.

According to the junction structure of the first embodiment as described above, the reliability of the junction between each terminal pad 120 lying inside the semiconductor device 200 and its corresponding BGA 250, i.e., the melted Pb-free solder ball 240 can be enhanced as compared with the junction structure according to the prior art.

Further, according to the junction structure of the first embodiment, the reliability of the junction between the terminal pad 520 of the substrate 500 and the BGA 250 of the semiconductor device 200 can be enhanced as compared with the junction structure according to the prior art.

When the reliability of the junction between the terminal pad 120 lying inside the semiconductor device 200 and the BGA 250, and the reliability of the junction between the terminal pad 520 of the substrate 500 and the BGA 250 of the semiconductor device 200 are enhanced, compared to the junction structure according to the prior art, the amount of usage of the Pb-free solder ball 240 that constitutes each BGA 250 can be reduced to an amount less than that of a semiconductor device 100 according to the prior art. Therefore, according to the junction structure of the first embodiment, the semiconductor device 200 can be fabricated thinner than the semiconductor device 100 according to the prior art.

Second Preferred Embodiment

A junction structure according to a second embodiment will be described below in detail with a semiconductor device having this junction structure as an example. Incidentally, the second embodiment is configured such that a Zn system material (Zn in the present embodiment) is disposed on a terminal pad by plating.

Configuration of Semiconductor Device

The configuration of the semiconductor device (hereinafter called "semiconductor device according to the second embodiment") having the junction structure according to the second embodiment will be explained below with reference to FIG. 7. Incidentally, as the semiconductor device, a semiconductor chip equipped with an LGA will be described here by way of example.

In the first embodiment, a semiconductor chip equipped with BGA has been described as the semiconductor device 200 by way of example. In the semiconductor device 200, the height from the solder terminal, i.e., the exposed surface of the Cu pad 120 to the tip of the BGA 250 (refer to FIG. 2(D)) is relatively high, and the height therebetween is 250 µm or so in the case of, for example, a 0.5 mm-pitch terminal.

On the other hand, in the second embodiment, the semiconductor chip equipped with LGA will be described as the semiconductor device 700 by way of example. In the present semiconductor device 700, the height from a solder terminal, i.e., an exposed surface of a Cu pad 120 to the tip of the LGA 750 (refer to FIG. 8(D)) is lower than that from that of the solder terminal of the semiconductor device 200, and the height therebetween is less than or equal to 100 µm.

Figure 7:
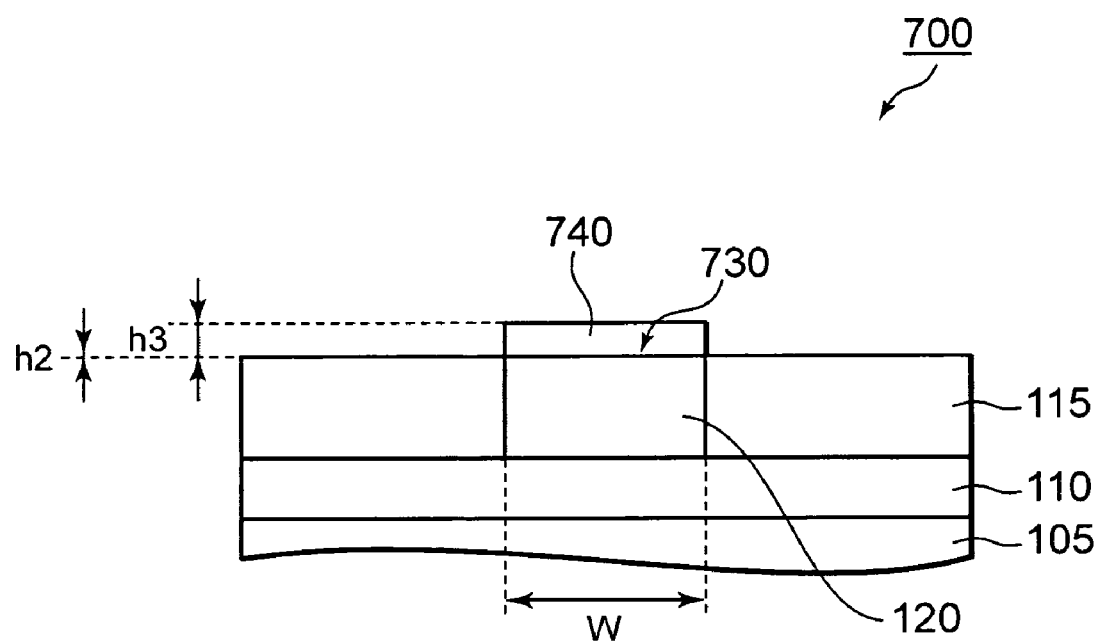
FIG. 7 is a configuration diagram of a semiconductor device having a junction structure according to a second embodiment.

In the semiconductor device 700 according to the second embodiment, as shown in FIG. 7, a layer of Zn 730 is disposed on the Cu pad 120 by plating.

Incidentally, "w" in FIG. 7 indicates the width of each of the Cu pad 120 and the Zn 730, and "h2" in FIG. 7 indicates the height of the layer of Zn 730. The widths, w, of the Cu pad 120 and the Zn 730 range from about 100 µm to 400 µm. The height, h2, of the layer of Zn 730 ranges from about 0.1 µm to 5 µm.

Pb-free solder paste 740 is disposed on the Zn 730 by printing.

Incidentally, Sn—Ag—Cu system solder becomes main stream as the material for the Pb-free solder paste 740. Thus, the Pb-free solder paste 740 will be explained here as Sn—Ag—Cu system solder paste.

Incidentally, "h3" indicates the height of the Pb-free solder paste 740 in FIG. 7. The height, h3, of the Pb-free solder paste 740 ranges from about 20 µm to 30 µm.

Meanwhile, the Zn 730 has the above three characteristics (1) through (3) described in the chapter, "Characteristics of Zn system material" of the first embodiment in a manner similar to the Zn system material 230.

Thus, the semiconductor device 700 can bring about an operative effect similar to that of the semiconductor device 200 according to the first embodiment.

That is, the semiconductor device 700 is capable of delaying the occurrence of cracks due to thermal stress in the junction portion between the terminal pad 120 lying inside the semiconductor device 700 and the solder paste 740. As a result, the semiconductor device 700 is capable of enhanced reliability of the junction between the terminal pad 120 lying inside the semiconductor device 700 and the solder paste 740.

Manufacturing Process of Semiconductor Device

A process for manufacturing the semiconductor device 700 will be explained below with reference to FIGS. 8(A) through (D) and FIG. 3.

Figure 8A:
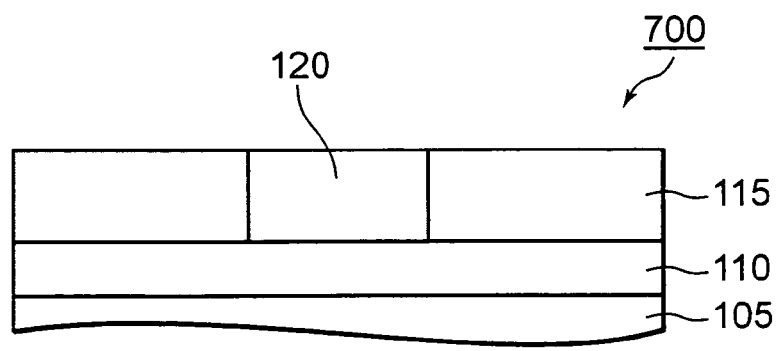
FIGS. 8A-8D is a manufacturing process diagram of the semiconductor device having the junction structure according to the second embodiment.

As shown in FIG. 8(A), a structure in which a terminal pad 120 is formed over an underbed or underlying base 105 of the semiconductor device 700 is prepared. Since the present structure is similar to the structure of the semiconductor device 200 shown in FIG. 2(A), its detailed description is omitted here.

Figure 8B:
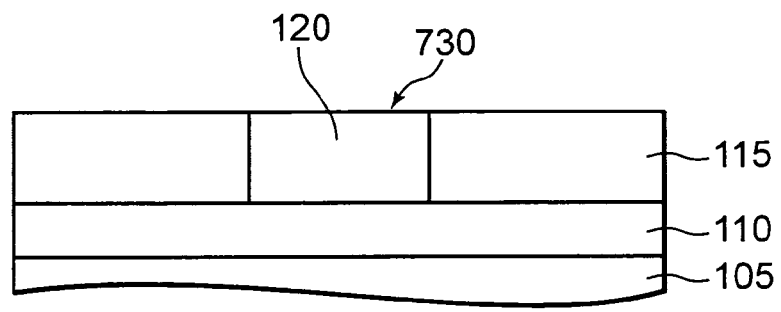

Next, as shown in FIG. 8(B), an oxide film is removed from an exposed surface of a Cu pad 120. Thereafter, Zn 730 is disposed on the Cu pad 120 by plating. Thus, a Zn system material softer than a Pb-free solder paste (Sn—Ag—Cu system solder paste in the present embodiment) 740 is disposed directly on its corresponding terminal pad 120 of the semiconductor device 700.

Figure 8C:
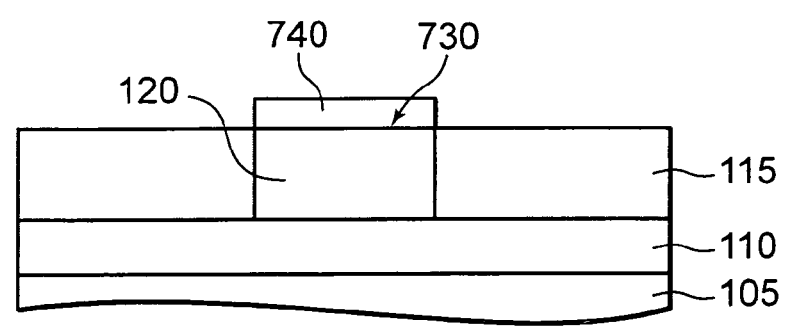

Next, as shown in FIG. 8(C), the Pb-free solder paste 740 is placed on the Zn 730 by printing.

Figure 8D:
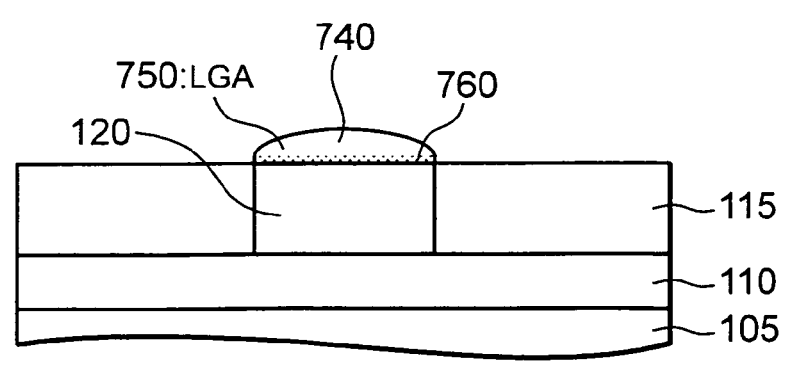

Next, as shown in FIG. 8(D), a reflow process is carried out along the processing temperatures shown in FIG. 3 to melt the Pb-free solder paste 740.

During the reflow process, the Pb-free solder paste 740 melts to bond to the Cu pad 120 together with the Zn 730, thereby forming an LGA 750.

At this time, the Zn 730 reacts with the Cu pad 120 at a portion bonded to the Cu pad 120. Thus, a layer of a Zn-containing intermetallic reactive product (hereinafter called "Zn-containing intermetallic reactive product" or simply called "intermetallic reactive product") 760 is formed between the Pb-free solder paste 740 and the Cu pad 120. Incidentally, a Cu—Zn reactive product is formed as the intermetallic reactive product 760.

Incidentally, Zn is an easily oxidizable metal. Therefore, there is a need to carry out the reflow process in a nitrogen atmosphere.

Since thermal stress is easily concentrated on the junction portion between the solder paste 740 and the Cu pad 120 in the semiconductor device 700, the Zn 730 having the characteristics (1) through (3) referred to above is laid out at the junction portion. Thus, the semiconductor device 700 makes an improvement in resistance of the junction portion to thermal stress in a manner similar to the semiconductor device 200 according to the first embodiment.

Incidentally, one based on the process step shown in FIG. 8(B) can be shipped as the semiconductor device 700.

Evaluation of Resistance of Semiconductor Device to Thermal Stress

The evaluation of the resistance to thermal stress is effected on the semiconductor device 700 by a method or technique similar to the first embodiment.

An evaluating process is effected on the semiconductor device 700 in which, in the case of a 0.5 mm-pitch terminal, for example, the width, w, of each of the Cu pad 120 and the Zn 730 is set to 100 to 400 μm, the height, h2, of the Zn 730 is set to 0.1 to 5 μm, and the print height, h3, of the Pb-free solder paste 740 is set to 60 to 70 μm (refer to FIG. 7). Incidentally, the height of the solder terminal is in the neighborhood of 40 μm in the case of, for example, a 0.2 mm-pitch terminal, and might be changed depending upon terminal pitch.

According to the semiconductor device 700 of the second embodiment, the occurrence of cracks in the junction portion between the Cu pad 120 lying inside the semiconductor device 700 and the solder paste 740 can be delayed as compared with the semiconductor device 100 of the prior art in a manner similar to the semiconductor device 200 according to the first embodiment.

Mounting Structure of Semiconductor Device

A mounting structure (hereinafter called "mounting structure according to the second embodiment") of a semiconductor device having the junction structure according to the second embodiment will be described below with reference to FIG. 9.

Figure 9A:
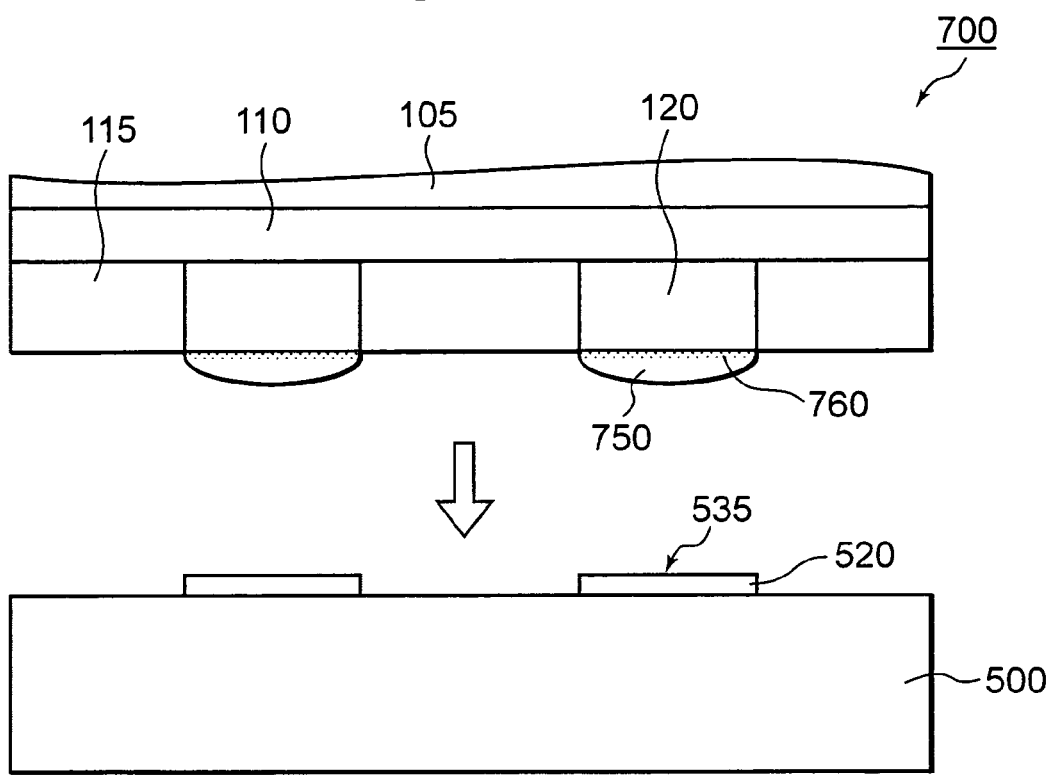
FIGS. 9A and 9B show a mounting process diagram of the semiconductor device having the junction structure according to the second embodiment.

As shown in FIG. 9(A), Cu pads 520 are disposed on a substrate 500 at predetermined positions respectively. A layer of Zn 535 is disposed on each Cu pad 520 by plating.

In the mounting structure according to the second embodiment, the semiconductor device 700 and the substrate 500 are laid out in such a manner that the surface on the formed side of each Cu pad 120 and the surface on the formed side of each Cu pad 520 are opposite one another. In the example shown in FIG. 9(A), the surface on the side of formation of each Cu pad 120 is turned downward and the semiconductor device 700 is disposed on the substrate 500.

At this time, the layer of Zn 535 is disposed between the LGA 750 of the semiconductor device 700 and the Cu pad 520 of the substrate 500.

In this state, the LGA 750 is subjected to a reflow process, that is, a heating process for reflowing the LGA 750 is performed to melt the LGA 750.

Figure 9B:
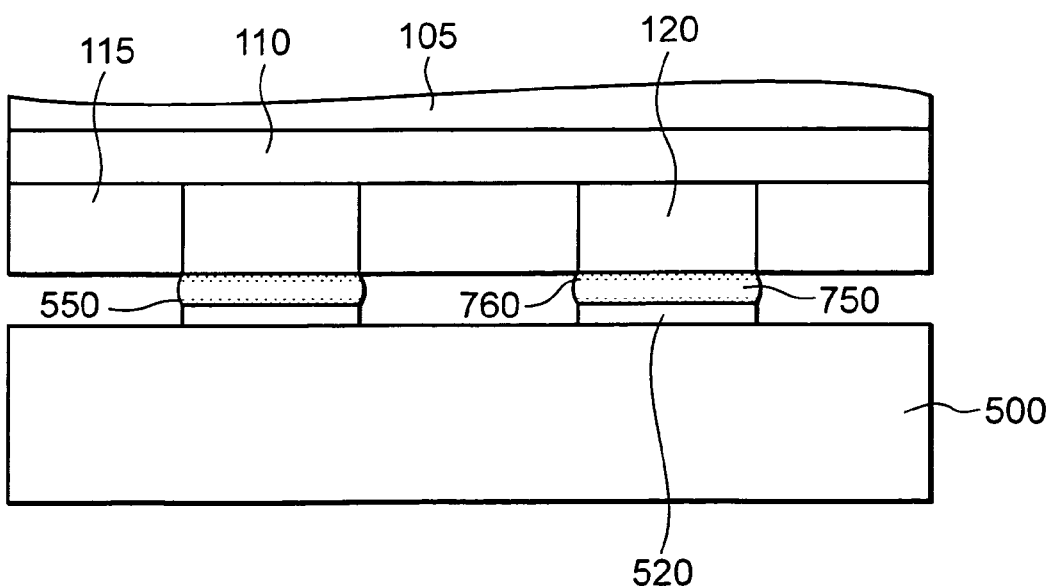

With the reflow process, the LGAs 750 melt to bond to their corresponding Cu pads 520 together with the Zn 535 as shown in FIG. 9(B).

At this time, the Zn 535 react with the Cu pads 520 at portions bonded to the Cu pads 520 respectively. Thus, a layer of a Zn-containing intermetallic reactive product 550 is formed between each of the LGAs 750 and each of the Cu pads 520. Incidentally, a Cu—Zn reactive product is formed as the Zn-containing intermetallic reactive product 550.

Since the Zn 535 having the characteristics (1) through (3) is laid out between each LGA 750 of the semiconductor device 700 and each terminal pad 520 of the substrate 500, the mounting structure according to the second embodiment shown in FIG. 9 is capable of enhanced resistance of the junction portion between the LGA 750 of the semiconductor device 700 and the terminal pad 520 of the substrate 500 to thermal stress. Therefore, although cracks are eventually produced in the junction portion between the LGA 750 of the semiconductor device 700 and the terminal pad 520 of the substrate 500 due to thermal stress, the mounting structure is capable of delaying the occurrence of cracks. As a result, the present mounting structure is able to enhance reliability of the junction between the LGA 750 of the semiconductor device 700 and the terminal pad 520 of the substrate 500.

According to the junction structure of the second embodiment as described above, the reliability of the junction between each terminal pad 120 lying inside the semiconductor device 700 and its corresponding LGA 750, i.e., the melted Pb-free solder paste 740 can be enhanced as compared with the junction structure according to the prior art regardless of the fact that the height of the solder terminal is lower than that in the semiconductor device 200 according to the first embodiment.

Further, according to the junction structure of the second embodiment, the reliability of the junction between the terminal pad 520 of the substrate 500 and the LGA 750 of the semiconductor device 700 can be enhanced as compared with the junction structure according to the prior art.

When the reliability of the junction between the terminal pad 120 lying inside the semiconductor device 700 and the LGA 750 and the reliability of the junction between the terminal pad 520 of the substrate 500 and the LGA 250 of the semiconductor device 700 are enhanced, compared to the junction structure according to the prior art, the amount of usage of the Pb-free solder paste 740 that constitutes each LGA 750 can be reduced to an amount less or smaller than that for a semiconductor device equipped with an LGA according to the prior art. Therefore, according to the junction structure of the second embodiment, the semiconductor device 700 can be fabricated thinner than a semiconductor device equipped with an LGA according to the prior art.

Incidentally, the junction structure according to the second embodiment can be applied even to the semiconductor device 200 equipped with BGA in which the height of the solder terminal is high. Since, however, the layer of Zn 535 is disposed on the substrate 500 in advance by plating, the junction structure becomes higher in cost than the mounting structure according to the first embodiment.

The present invention is not necessarily limited to the embodiments referred to above. Various changes and modifications can be made thereto within the scope not departing from the gist of the present invention.

Figure 10:
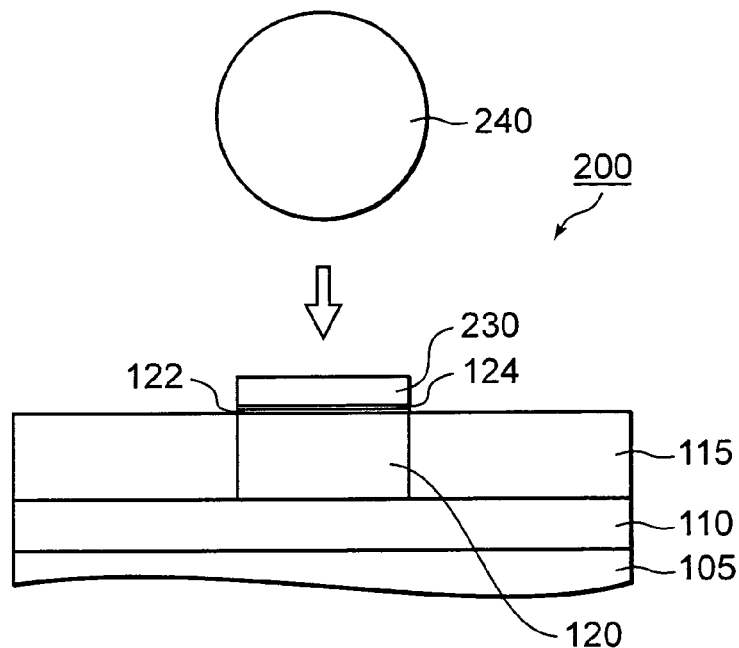
FIG. 10 is a configuration diagram of a modification of a semiconductor device.

For, example, the terminal pad can be brought to a multi-layer structure constituted by overlapping of various materials. FIG. 10 is a configuration diagram of a modification of a semiconductor device. As shown in FIG. 10, a terminal pad can be brought to a structure in which Ni (nickel) 122 is disposed on a Cu pad 120 and Pd (palladium) 124 is further disposed thereon. Incidentally, Au (gold) and other materials may be laid out instead of Pd (palladium) 124.

For instance, the manufacturing method of the first embodiment may be applied to the semiconductor device equipped with the LGA. Incidentally, a manufacturing process in this case is as follows. Sn—Zn solder paste is printed once and thereafter the semiconductor device is caused to pass through a reflow furnace. Afterwards, Pb-free solder paste, such as a Sn—Ag—Cu system or the like, is printed and the semiconductor device is inserted through the reflow furnace again. In the thus-manufactured semiconductor device equipped with the LGA, however, the height of the solder terminal cannot be lowered as compared with the semiconductor device 700 equipped with the LGA, which has been manufactured by the manufacturing method of the second embodiment 2.

Junction structures according to the first and second embodiments can be implemented even where the solder is a Pb solder.

Further, the layer of Zn 535 according to the second embodiment may be formed by means, such as electrolytic plating, electroless plating, sputter, vapor deposition, etc.

What is claimed is:

1. A method for manufacturing a semiconductor device, comprising:
   providing disposing a Zn system material directly on a copper terminal pad formed over an underlying base;
   disposing a Pb-free solder ball over the Zn system material; and
   performing a heating process for reflowing the Pb-free solder ball to thereby form a reactive product layer constituted of a component of the copper terminal pad and a component of the Zn system material between the copper terminal pad and the Pb-free solder ball.

2. The method according to claim 1, wherein providing the Zn system material directly on the copper terminal pad is accomplished by printing, and wherein disposing the Pb-free solder ball over the Zn system material is accomplished by mounting.

3. The method according to claim 2, wherein the Zn system material has a thickness ranging from 10 μm to 60 μm.

4. The method according to claim 1, wherein providing the Zn system material directly on the copper terminal pad is accomplished by plating, wherein disposing the Pb-free solder ball over the Zn system material is accomplished by printing a Pb-free solder paste thereon; and wherein performing the heating process for reflowing reflows the Pb-free solder paste to thereby form said reactive product layer.

5. The method according to claim 4, wherein the Zn system material has a thickness ranging from 0.1 μm to 5 μm.

6. The method according to claim 1, wherein the reactive product layer is an intermetallic reactive product that is a Cu—Zn reactive product.

* * * * *